(12) United States Patent
Lu et al.

(10) Patent No.: US 10,518,296 B2
(45) Date of Patent: Dec. 31, 2019

(54) PIPING SYSTEM

(71) Applicant: Winbond Electronics Corp., Taichung (TW)

(72) Inventors: Peng-Tan Lu, Hsinchu (TW); Chun-Chieh Chou, Taichung (TW); Chun-Pin Huang, Changhua County (TW); Liang-Chih Chang, Taichung (TW); Chih-Nan Lin, Changhua County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/823,054

(22) Filed: Nov. 27, 2017

(65) Prior Publication Data

US 2018/0345329 A1 Dec. 6, 2018

(30) Foreign Application Priority Data

Jun. 1, 2017 (CN) .......................... 2017 1 0402771

(51) Int. Cl.
*B01D 53/18* (2006.01)
*B08B 3/10* (2006.01)
*H01L 21/67* (2006.01)
*B01D 53/78* (2006.01)

(52) U.S. Cl.
CPC .............. *B08B 3/104* (2013.01); *B01D 53/18* (2013.01); *B01D 53/78* (2013.01); *H01L 21/67057* (2013.01); *B01D 2252/103* (2013.01); *B01D 2258/0216* (2013.01); *H01L 21/67017* (2013.01)

(58) Field of Classification Search
CPC .............. B01D 53/18; B01D 2252/103; B01D 2258/0216; B08B 3/104; H01L 21/67057
USPC .......................................................... 134/95.3
See application file for complete search history.

(56) References Cited

U.S. PATENT DOCUMENTS 5,597,264 A    1/1997  Laak

FOREIGN PATENT DOCUMENTS

| CN | 203155067 U | 8/2013 |
|---|---|---|
| CN | 204233918 U | 4/2015 |
| CN | 105782717 A | 7/2016 |
| CN | 206103601 U | 4/2017 |
| TW | 200709844 A | 3/2007 |
| TW | M526593 U | 8/2016 |

*Primary Examiner* — Levon J Shahinian
(74) *Attorney, Agent, or Firm* — Muncy, Geissler, Olds & Lowe, P.C.

(57) ABSTRACT

A piping system is provided, connecting a plurality of scrubbers which are disposed on a supporting structure, including a collecting pipe and a drain pipe. The collecting pipe has a main body and a plurality of protrusions, wherein the main body has an outer surface and a first central axis. The protrusions are protruding from the outer surface, and the first central axis is perpendicular to the supporting structure. The collecting pipe communicates with the scrubbers via the protrusions. The drain pipe is disposed under the supporting structure and has a second central axis, wherein the collecting pipe is extended through the supporting structure and connects to the drain pipe, and the first central axis is perpendicular to the second central axis.

18 Claims, 6 Drawing Sheets

PIPING SYSTEM

CROSS REFERENCE TO RELATED APPLICATIONS

This application claims the benefit of China Patent Application No. 201710402771.7, filed on Jun. 1, 2017, the entirety of which is incorporated by reference herein.

BACKGROUND OF THE INVENTION

Field of the Invention

The application relates in general to a piping system, and in particular to a piping system including a collecting pipe having a plurality of protrusions.

Description of the Related Art

In the semiconductor industry, a variety of chemicals (including gases and liquids) are used when preforming semiconductor processes, such as performing a washing process. Washing equipment, such as a wet scrubbing implement, is used to absorb the pollutants of wastes (such as waste gases), to achieve the purpose of cleaning and washing. Cleaning a variety of different wastes requires the use of different chemicals and scrubbers. After the wastes are washed by the washing chemicals, the used chemicals will flow to a collecting pipe to be collected, and then will be discharged to a main pipe for the process of waste treatment. The connection and configuration of the scrubbers and the drain pipes is often limited by space so that one or more flexible connecting pipes are used for connection. However, these flexible pipes can easily rupture when a pressurizing motor is used to pressure the chemicals for draining, and the chemicals or particles can easily accumulate in the pipes because of an improper piping configuration due space constraints, and the improper piping configuration also causes inspection and maintenance to be difficult.

BRIEF SUMMARY OF INVENTION

To address the deficiencies of conventional piping systems, an embodiment of the invention provides a piping system, connecting a plurality of scrubbers which are disposed on a supporting structure, including a collecting pipe and a drain pipe. The collecting pipe has a main body and a plurality of protrusions, wherein the main body has an outer surface and a first central axis. The protrusions protrude from the outer surface, and the first central axis is perpendicular to the supporting structure. The collecting pipe communicates with the scrubbers via the protrusions. The drain pipe is disposed under the supporting structure and has a second central axis, wherein the collecting pipe passes through the supporting structure and connects to the drain pipe, and the first central axis is perpendicular to the second central axis.

In some embodiments, the main body and the protrusions are integrally formed in one piece.

In some embodiments, the protrusions are arranged to surround the outer surface.

In some embodiments, the collecting pipe has a diameter of 4 to 6 inches, and the protrusions have diameters of 0.5 to 1.5 inches.

In some embodiments, the protrusions include a transparent material.

In some embodiments, one of the protrusions includes a main channel and a sub channel which are interconnected, the sub channel protrudes from a side of the main channel, and the main channel communicates with the collecting pipe.

In some embodiments, the collecting pipe includes a material which is polyvinyl chloride, polypropylene, or phenol formaldehyde resin.

In some embodiments, the piping system further comprises a plurality of connecting pipes connecting the scrubbers to the collecting pipe, and the connecting pipes have a vertical flow section perpendicular to the supporting structure.

In some embodiments, the piping system further comprises a fence fixed to the supporting structure and surrounding the collecting pipe.

In some embodiments, the piping system further comprises a receiving groove disposed under the drain pipe, configured to receive the washing liquid leaking from the drain pipe.

In some embodiments, the protrusions are arranged in a staggered manner on the outer surface.

In some embodiments, each of the protrusions is detachably connected to the main body.

In some embodiments, the support structure has a through hole, and the collecting pipe passes through the through hole.

An embodiment of the invention provides a piping system, connecting a plurality of scrubbers which are disposed on a supporting structure, including a collecting pipe, a plurality of connecting pipes and a drain pipe. The collecting pipe has a main body and a plurality of protrusions, wherein the main body has an outer surface and a first central axis. The protrusions are disposed on the main body and protrude from the outer surface. The collecting pipe communicates with the scrubbers via the protrusions. The connecting pipes connect the scrubbers to the collecting pipe, wherein the main body communicates with the scrubbers via the protrusions and the connecting pipes. The drain pipe is disposed under the supporting structure and has a second central axis, wherein the collecting pipe is perpendicular to and passes through the supporting structure and connects to the drain pipe, and the first central axis is perpendicular to the second central axis.

In some embodiments, the protrusions are detachably connected to the main body.

In some embodiments, when one of the protrusions is detached from the main body, a lid is provided to cover an opening of the main body.

In some embodiments, the protrusions are arranged to surround the outer surface.

In some embodiments, at least one of the protrusions includes a main channel and a sub channel which are interconnected, the sub channel protrudes from a side of the main channel, and the main channel communicates with the collecting pipe, wherein the main channel and the sub channel are configured to connect the scrubbers via the connecting pipes.

In some embodiments, the protrusions are arranged in a staggered manner.

In some embodiments, the protrusions include a transparent material.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the piping systems are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted by an idealized or overly formal manner unless defined otherwise.

Figure 1:
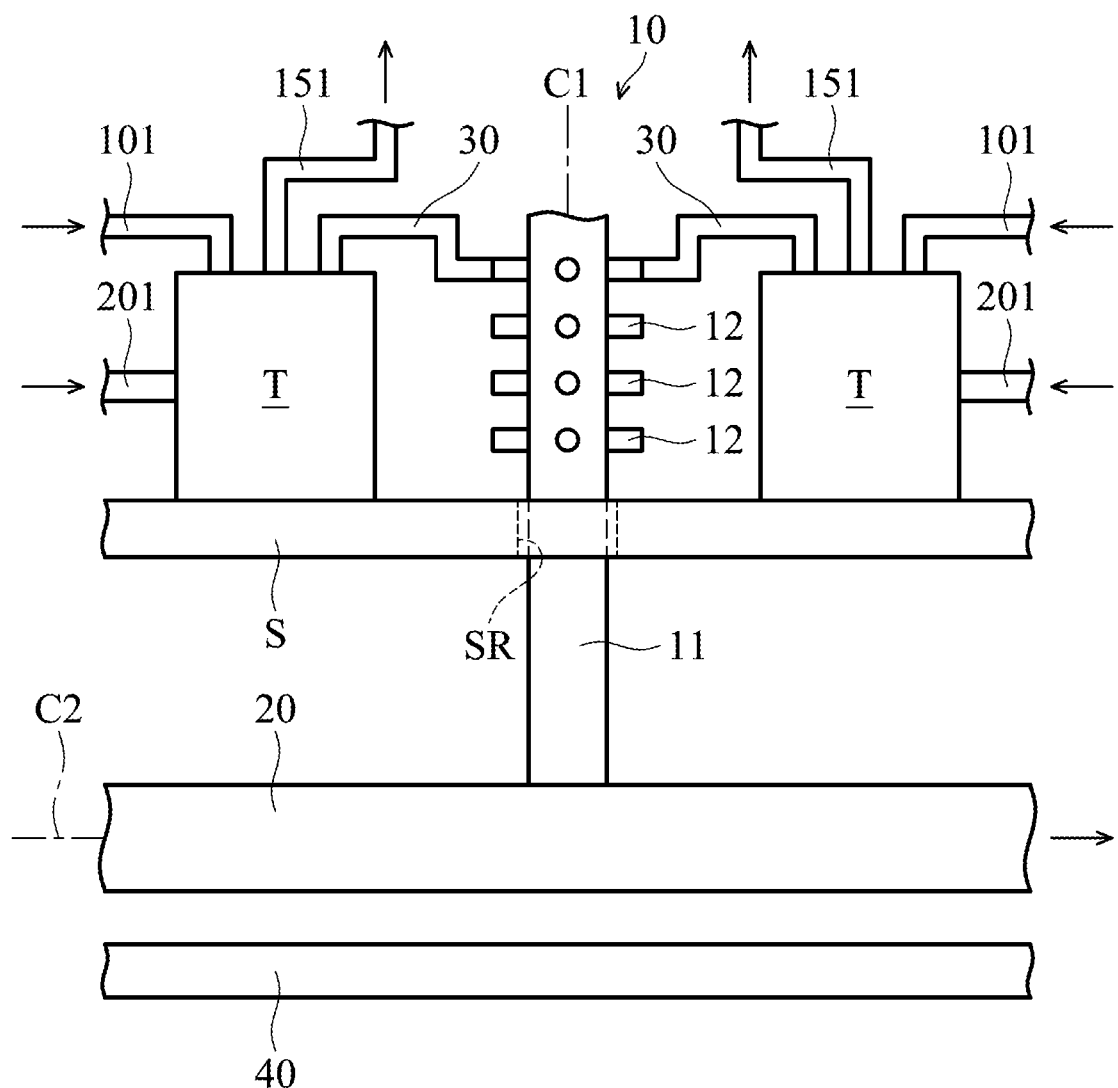
FIG. 1 is a schematic diagram of a piping system according to an embodiment of the invention.

FIG. 1 is a schematic diagram of a piping system connecting a plurality of scrubbers T according to an embodiment of the invention. As shown in FIG. 1, the pipe system may be arranged in a semiconductor fabrication plant and connects to a plurality of scrubbers T, wherein the scrubbers T may be an apparatus for treating waste gases (or exhaust gases) and contaminants in a semiconductor process, such as wet scrubbers or cross flow scrubbers. In the semiconductor process, common waste gases or liquids, such as acid gases containing sulfuric acid ($H_2SO_4$) and acetic acid ($CH_3COOH$), alkaline gases containing potassium hydroxide (KOH) and sodium hydroxide (NaOH), toxic gases containing hydrogen cyanide (HCN) and diborane ($B_2H_6$), and organic solvents containing toluene ($C_6H_5$—$CH_3$) and acetone ($C_3H_6O$), etc., may be transferred to the scrubbers T and be washed by the appropriate washing liquids, scrubbing liquids, absorbing liquids or cleaning solutions, to achieve the purpose of prevention and control of semiconductor pollutants.

Please continue referring to FIG. 1, the piping system primarily comprises a collecting pipe 10, a drain pipe 20, and a plurality of connecting pipes 30 respectively connecting to the different scrubbers T. The scrubbers T are disposed on a supporting structure S, and the collecting pipe 10 passes through the supporting structure S via a through hole SR thereof to connect the drain pipe 20 which is disposed under the supporting structure S. The supporting structure S, for example, is a floor which can be used as an intervening floor or a floor slab. In other words, the upper part of the support structure S is the upper floor and the lower is the lower floor. In the present embodiment, the scrubbers T are disposed on the upper floor, the drain pipe 20 is provided on the lower floor, and the collecting pipe 10 passes through the supporting structure S to connect the scrubbers T on the upper floor and connects the drain pipe 20 on the lower floor.

In the washing process for exhaust gas, first, the exhaust gas enters the scrubbers T from the pipes 101, and then one or more washing liquids, cleaning liquids, absorbing liquids, or appropriate washing chemicals is/are fed from the pipes 201 into the scrubbers T, so that the exhaust gas is washed. Thereafter, the washed gas may be discharged from the pipes 151, and the used waste liquid (or including crystals) enters the collecting pipe 10 via the connecting pipes 30, which may be pressured by a pressurizing motor or a pump so that the waste liquid flows successfully to the collecting pipe 10.

Figure 2A:
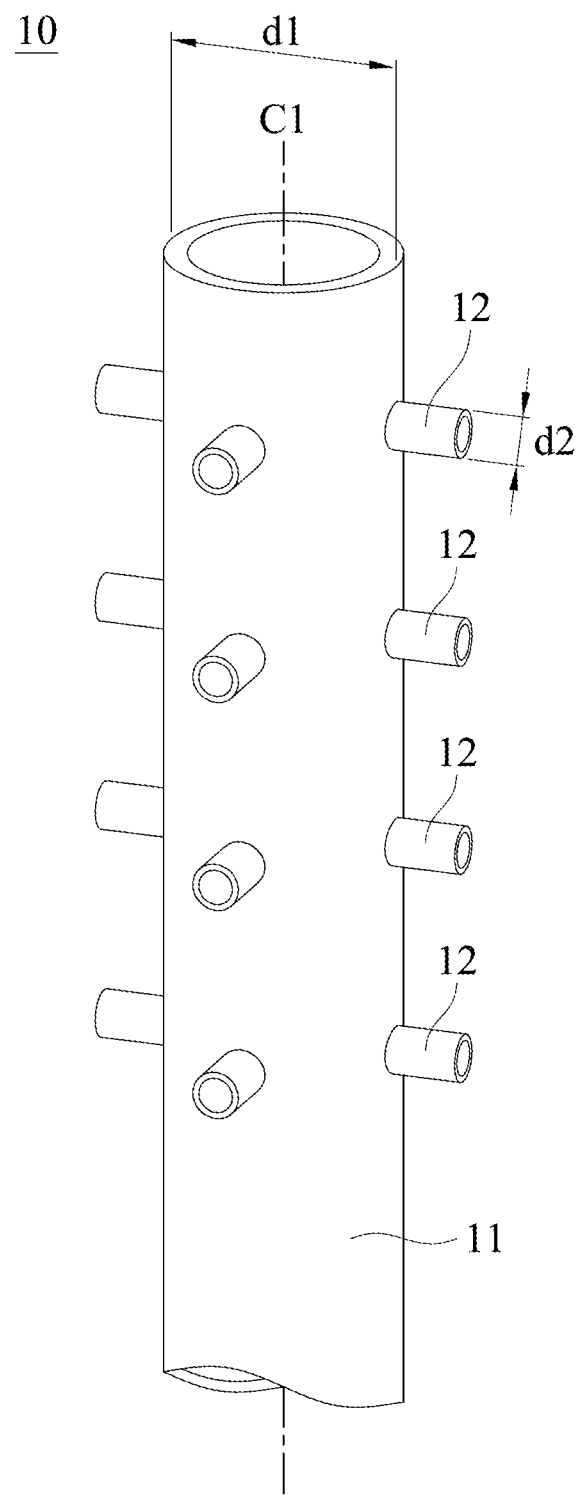
FIG. 2A is a schematic diagram of the collecting pipe in FIG. 1.

FIG. 2A is a schematic diagram of the collecting pipe 10. As shown in FIGS. 1 and 2A, the collecting pipe 10 substantially is a rigid pipe having a main body 11 and a plurality of protrusions 12. The main body 11 substantially is a hollow tubular structure and has a first central axis C1. The protrusions 12 protrude from the outer surface of the main body 11 and are arranged to surround the outer surface (circumferentially arranged). In the present embodiment, four protrusions 12 are arranged around the main body 11 on a reference plane perpendicular to the first central axis C1 of the main body 11. As a result, each scrubber T disposed on the supporting structure S may connect to one of the protrusions 12 of the collecting pipe 10 which is the closest or the best one (considering the positions of the scrubbers T) via the connecting pipe 30 with the shortest or best path, to reduce the space occupied by the connecting pipes 30.

Figure 3:
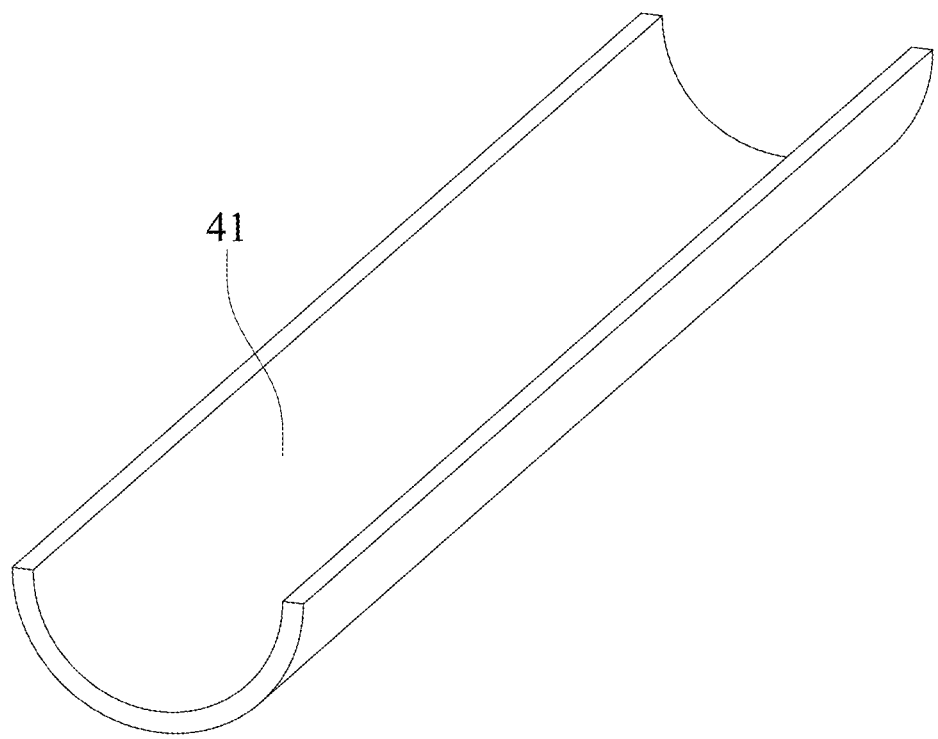
FIG. 3 is a partial schematic diagram of receiving groove.

Furthermore, the central axis C1 of the main body 11 is substantially perpendicular to a second central axis C2 of the drain pipe 20. That is, the collecting pipe 10 is substantially vertically connected to the drain pipe 20 (they are perpendicular to each other). Thus, compared with the conventional parallel connection mode, when the fluid or chemicals in the collecting pipe 10 flows to the drain pipe 20, it is possible to greatly reduce the occurrence of depositing of the fluid or particles in the pipe due to the flow path of the collecting pipe 10 perpendicular to the horizontal plane, and to reduce the load on the pressurizing motor, to avoid the situation of overload. In addition, referring to FIGS. 1 and 3, the piping system further comprises a receiving groove 40 disposed under the drain pipe 20 and having a long groove 41. When the drain pipe 20 leaks fluid due to any tiny cracks, the fluid may be received in time by the receiving groove 40, so that an operator can easily find that there is a rupture (or more ruptures) at a certain position of the drain pipe 20, and the drain pipe 20 may be treated immediately.

In FIG. 2A, the maim body 11 of the collecting pipe 10 has a diameter d1 of 6 inches, and the protrusion 12 has a diameter d2 of 4 inches. In other embodiments, the diameter d1 of the main body 11 may be 4 to 6 inches and the diameter d2 of the protrusion 12 may be 0.5 to 1.5 inches. Further, as shown in FIG. 2A, each protrusion 12 is detachably connected to the main body 11. For example, the protrusion 12 is a union joint, wherein one end of it is connected to the main body 11 and the other end is connected to the connecting pipe 30 (as shown in FIG. 1), and the connecting pipe 30 has a vertical flow path section perpendicular to the supporting structure S. In another embodiment, the main body 11 and the protrusions 12 are integrally formed in one piece.

The collecting pipe 10 may has a material such as polyvinyl chloride (PVC), polypropylene (PP) or phenol formaldehyde resin (PF), which may be chosen for using according to the kinds of waste liquid and chemicals exhausted by each scrubber T. For example, an operator may select the collecting pipe 10 with PP material to resist organic solvent; select the collecting pipe 10 with PVC material to be resistant to strong acid, strong base and high temperature liquid. The protrusion 12 may include (or be made of) a transparent material so that an operator can easily know whether the junction of the connecting pipe 30 and the collecting pipe 10 is clogged or not. In the present embodiment, when the protrusion 12 is not connected to any connecting pipe 30, it can be removed from the outer surface of the main body 11, and a cover (or a lid) may be provided to cover the opening of the main body 11, or the cover may cover the opening of the protrusion 12 directly (the protrusion 12 is not removed from the main body 11).

Figure 2B:
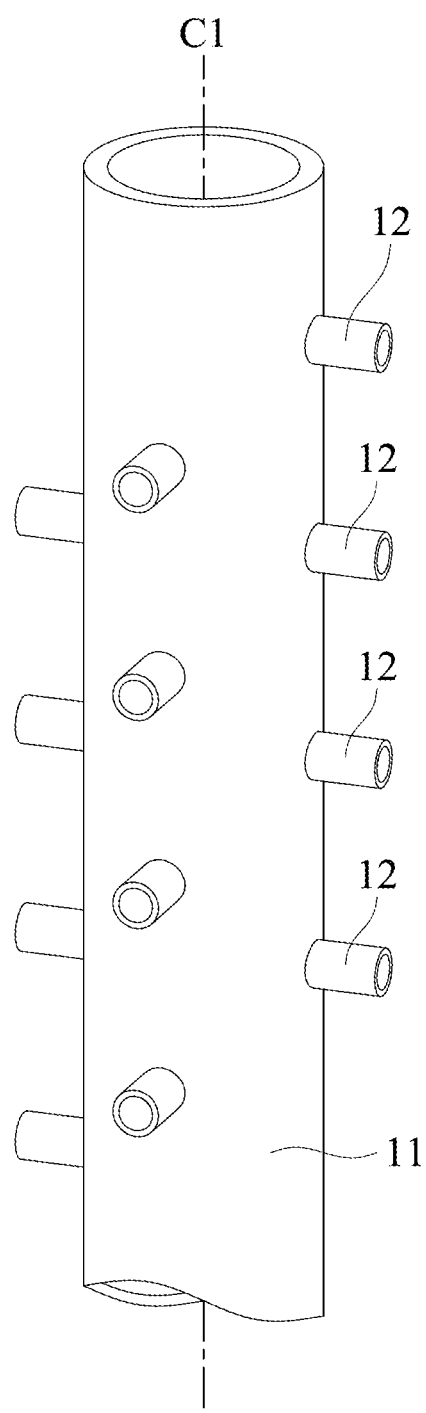
FIG. 2B is a schematic diagram of another collecting pipe according to an embodiment of the invention.

FIG. 2B is a schematic diagram of another collecting pipe 10' according to an embodiment of the invention. The main difference between the collecting pipe 10' and the collecting pipe 10 (FIG. 2A) is that the protrusions 12 in the present embodiment are arranged in a staggered manner, to make full use of space and be a more flexible configuration of pipes.

Figure 4:
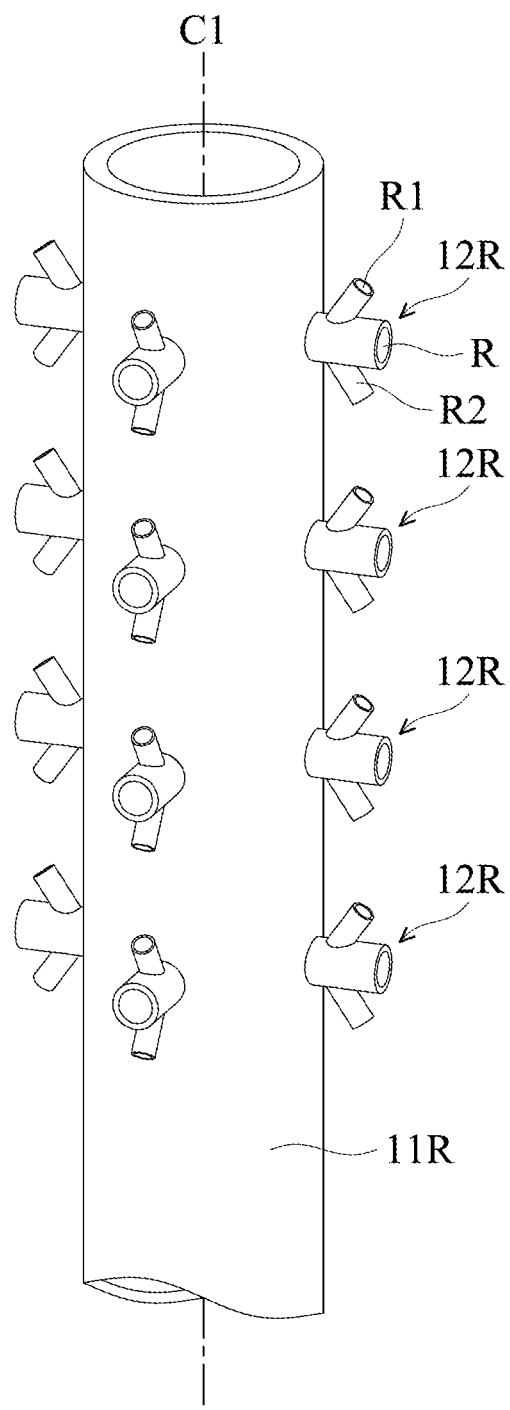
FIG. 4 is a schematic diagram of another collecting pipe according to an embodiment of the invention.

FIG. 4 is a schematic diagram of another collecting pipe 10R according to an embodiment of the invention. The main difference between the collecting pipe 10R and the collecting pipe 10 (FIG. 2A) is that the protrusions 12R disposed on the main body 11R are different from the protrusions 12 disposed on main body 11. Each protrusion 12R has a trident structure and includes a main channel R and two sub channels R1 and R2. The sub channels R1 and R2 are communicated with the main channel R and respectively disposed on the opposite sides of the main channel R. The connecting pipe 30 may connect to the one of the main channel R and sub channels R1 and R2 by the design choice (considering the connecting path), and the remaining two may be covered or enclosed. In some embodiments, the protrusion 12R may only have one sub channel R1 or R2. In some embodiments, the sub channels R1 and R2 are connected to different connecting pipes 30. In some embodiments, the main channel R and two sub channels R1 and R2 are correspondingly connected to another connecting pipe which also has a trident structure. Therefore, the best or better connecting path is provided due to a plurality of protrusions 12R having trident structures providing for the connecting pipe 30 to connect the scrubber T and the collecting pipe 10, in order to save space and avoid particles being deposited in the pipe.

Figure 5:
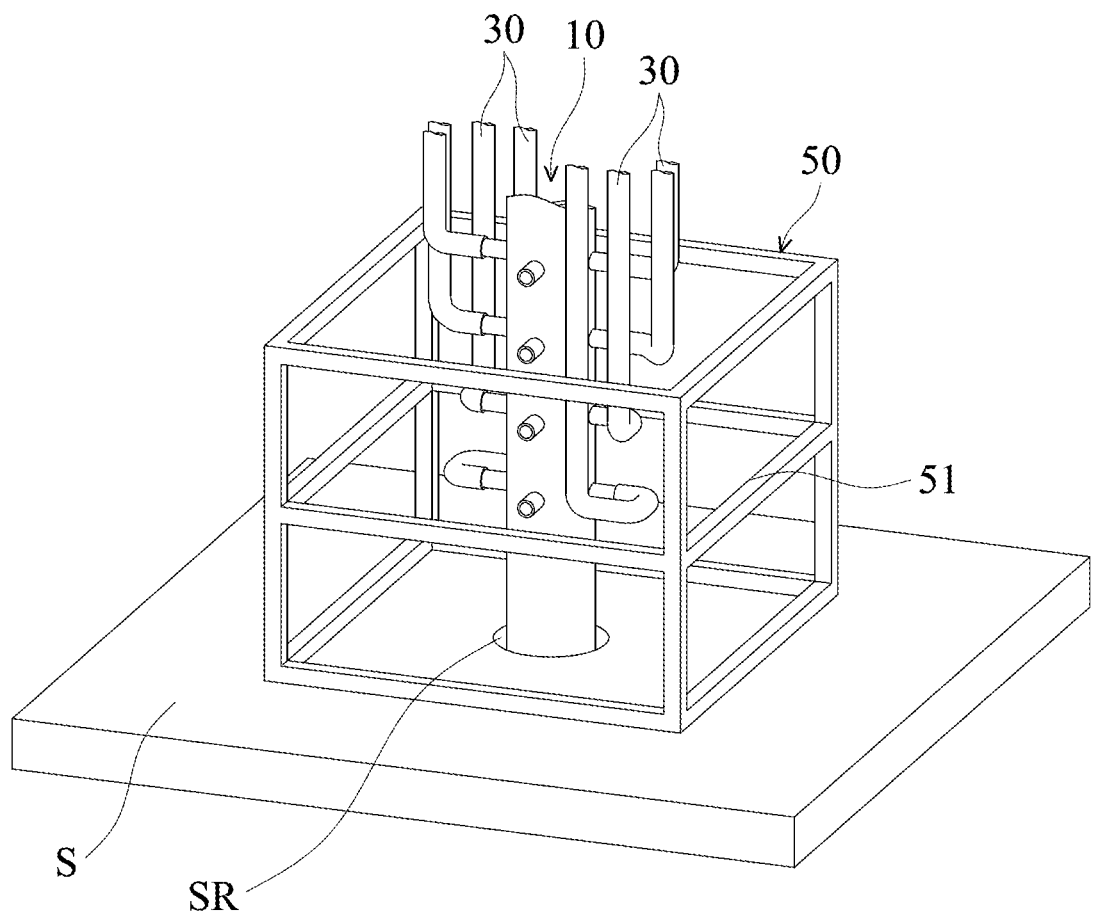
FIG. 5 is a schematic diagram of the collecting pipe in FIG. 2A connecting a plurality of connecting pipes and a fence surrounding the collecting pipe.

FIG. 5 is a schematic diagram of the collecting pipe 10 in FIG. 2A connecting a plurality of connecting pipes 30 and a fence 50 provided to surrounding the collecting pipe 10. The piping system of the present embodiment may further comprises a fence 50 disposed on and fixed to the supporting structure S. As shown in FIG. 5, the fence 50 is surrounding the collecting pipe 10 to protect the collecting pipe 10 and the connecting pipes 30 to prevent them from being impacted by external objects. The fence 50 has a hollow structure 51, whereby it is convenient for an operator to see the connection of the connecting pipes 30 and the protrusions 12 in the horizontal direction, thereby making easier to inspect, disassemble or repair the connecting pipe 30 and the collecting pipe 10.

In summary, a piping system is provided, connecting a plurality of scrubbers which are disposed on a supporting structure. The piping system comprises a collecting pipe and a drain pipe. The collecting pipe has a main body and a plurality of protrusions, wherein the main body has an outer surface and a first central axis, and the protrusions are protruding from the outer surface. By the protrusions of the collecting pipe, it is possible to enhance and improve the connecting configuration of the scrubbers and the collecting pipe, so that it has the advantages of centralized management, convenient viewing and time saving. In addition, since the collecting pipe passes through the supporting structure and connects the drain pipe and the first central axis of the collecting pipe is perpendicular to the second central axis of the drain pipe, the fluid or chemicals is not easy to accumulate or deposit in the pipe, so that the situation of clogged may be avoided, and the load of motor for applying pressure may be reduced, to enhance the overall performance of the washing process.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A piping system, comprising:
   a supporting structure;
   a plurality of scrubbers, disposed on the supporting structure;
   a collecting pipe, having a main body and a plurality of protrusions, wherein the main body has an outer surface and a first central axis, the protrusions protrude from the outer surface, the first central axis is perpendicular to the supporting structure, and the collecting pipe communicates with the scrubbers via the protrusions, wherein the protrusions are arranged to surround the outer surface; and
   a drain pipe, disposed under the supporting structure and having a second central axis, wherein the supporting structure is between the scrubbers and the drain pipe in a direction of the first central axis, the collecting pipe passes through the supporting structure, the bottom of the collecting pipe in the direction of the first central axis directly connects the drain pipe, and the first central axis is perpendicular to the second central axis.

2. The piping system as claimed in claim 1, wherein the main body and the protrusions are integrally formed in one piece.

3. The piping system as claimed in claim 1, wherein the collecting pipe has a diameter of 4 to 6 inches, and the protrusions have diameters of 0.5 to 1.5 inches.

4. The piping system as claimed in claim 1, wherein the protrusions include a transparent material.

5. The piping system as claimed in claim 1, wherein one of the protrusions includes a main channel and a sub channel which are interconnected, the sub channel protrudes from a side of the main channel, and the main channel communicates with the collecting pipe.

6. The piping system as claimed in claim 1, wherein the collecting pipe includes a material which is polyvinyl chloride, polypropylene, or phenol formaldehyde resin.

7. The piping system as claimed in claim 1, further comprising a plurality of connecting pipes connecting the scrubbers to the collecting pipe, and the connecting pipes have a vertical flow section perpendicular to the supporting structure.

8. The piping system as claimed in claim 1, further comprising a fence fixed to the supporting structure and surrounding the collecting pipe.

9. The piping system as claimed in claim 1, further comprising a receiving groove disposed under the drain pipe, configured to receive a washing liquid leaking from the drain pipe.

10. The piping system as claimed in claim 1, wherein the protrusions are arranged in a staggered manner on the outer surface.

11. The piping system as claimed in claim 1, wherein each of the protrusions is detachably connected to the main body.

12. The piping system as claimed in claim 1, wherein the support structure has a through hole, and the collecting pipe passes through the throughhole.

13. A piping system, comprising:
a supporting structure;
a plurality of scrubbers, disposed on the supporting structure;
a collecting pipe, having a main body and a plurality of protrusions, wherein the main body has an outer surface and a first central axis, and the protrusions are disposed on the main body and protrude from the outer surface, wherein the protrusions are arranged to surround the outer surface;
a plurality of connecting pipes, connecting the scrubbers to the collecting pipe, wherein the main body communicates with the scrubbers via the protrusions and the connecting pipes; and
a drain pipe, disposed under the supporting structure and having a second central axis, and the supporting structure is between the scrubbers and the drain pipe in a direction of the first central axis, wherein the collecting pipe is perpendicular to and passes through the supporting structure and the bottom of the collecting pipe in the direction of the first central axis directly connects the drain pipe, and the first central axis is perpendicular to the second central axis.

14. The piping system as claimed in claim 13, wherein the protrusions are detachably connected to the main body.

15. The piping system as claimed in claim 13, wherein when one of the protrusions is detached from the main body, a lid is provided to cover an opening of the main body.

16. The piping system as claimed in claim 13, wherein at least one of the protrusions includes a main channel and a sub channel which are interconnected, the sub channel protrudes from a side of the main channel, and the main channel communicates with the collecting pipe, wherein the main channel and the sub channel are configured to connect the scrubbers via the connecting pipes.

17. The piping system as claimed in claim 1, wherein the protrusions are arranged in a staggered manner.

18. The piping system as claimed in claim 13, wherein the protrusions include a transparent material.

* * * * *